United States Patent [19]
Fryer

[11] Patent Number: 5,306,955
[45] Date of Patent: Apr. 26, 1994

[54] TWO-WIRE, ELECTRONIC SWITCH

[75] Inventor: Warren R. Fryer, New York, N.Y.

[73] Assignee: Control Products, Inc., East Hanover, N.J.

[21] Appl. No.: 688,849

[22] Filed: Apr. 22, 1991

[51] Int. Cl.[5] .................... H01H 35/00; H01H 37/00; G02B 27/00
[52] U.S. Cl. .................................. 307/116; 250/551; 307/117
[58] Field of Search ............... 307/310, 311, 116, 117; 250/551

[56] References Cited

U.S. PATENT DOCUMENTS

| | | | |
|---|---|---|---|
| 3,932,803 | 1/1976 | Buck | 307/644 |
| 4,158,144 | 6/1979 | Krause | 250/551 |
| 4,328,528 | 5/1982 | Kompelien | 307/311 X |
| 4,365,167 | 12/1982 | Weimer et al. | 307/66 |
| 4,414,478 | 11/1983 | Ueda et al. | 307/116 |
| 4,504,778 | 3/1985 | Evans | 323/323 |
| 4,551,640 | 11/1985 | Fukuyama et al. | 307/311 X |
| 4,730,115 | 3/1988 | Abe | 250/551 |
| 4,776,514 | 10/1988 | Johnstone et al. | 236/78 R |
| 4,905,309 | 2/1990 | Maisonneuve et al. | 455/603 |
| 4,906,858 | 3/1990 | Gesin | 307/117 X |
| 5,099,144 | 3/1992 | Sai | 250/551 |
| 5,151,602 | 9/1992 | Idaka et al. | 250/551 |

FOREIGN PATENT DOCUMENTS

WO83/00746  3/1983  PCT Int'l Appl. .................. 250/551

OTHER PUBLICATIONS

Radio Shack New 1974-75 Unabridged Dictionary of Electronics; edited by Rudolf Graf, pp. 423-425.
International Rectifier series PVI Microelectronic Isolator Data Sheet No. PD-1.029A; 1990.

Primary Examiner—A. D. Pellinen
Assistant Examiner—F. M. Fleming
Attorney, Agent, or Firm—Michael B. Einschlag

[57] ABSTRACT

Two-wire, electronic switch which performs sensing functions, measurement functions, and output-control functions for an electrical load without receiving power from a power source, external or internal, other than the power source for the electrical load that is controlled by the switch. Electronic components of a two-wire, electronic switch which is fabricated in accordance with the present invention obtain power: (a) when the switch is off, from a power source which drives a load which is controlled by the switch and (b) when the switch is on, from an output of devices which convert current to voltage and which receive at least a portion of a current through the load as input.

16 Claims, 4 Drawing Sheets

TWO-WIRE, ELECTRONIC SWITCH

TECHNICAL FIELD OF THE INVENTION

The present invention pertains to a two-wire, electronic switch which performs sensing functions, measurement functions, and output-control functions for an electrical load, which switch receives power only from a power source for the electrical load.

BACKGROUND OF THE INVENTION

FIG. 1 is a block diagram of a prior art circuit which comprises two-wire, electromechanical, thermal switch 200, which switch 200 is itself comprised of temperature sensing probe 210. Two-wire, electromechanical, thermal switch 200 turns electrical load 220 on or off whenever a specified temperature is detected by temperature sensing probe 210. As illustrated in FIG. 1, two-wire, electromechanical, thermal switch 200 comprises metallic contacts 215 for use in switching and switch 200 comprises mechanical components (not shown) for transforming a temperature difference into a change in a force-distance-product in temperature sensing probe 210—in this case temperature sensing probe 210 is a thermo-mechanical temperature sensing probe. Whenever switch 200 is on and electrical load 220 is being energized by power source 240, the voltage across terminals 217 and 219 of switch 200 is just the electrical drop across metallic contacts 215 and the connections thereto.

A switch like switch 200 of FIG. 1 is undesirable because metallic contacts 215: (a) erode from use; (b) generate an arc when switching occurs; and (c) often corrode from disuse. As a result of this, a solid state, electronic switch is an attractive alternative because, unlike a metallic contact switch, a solid state, electronic switch: (a) is indifferent to the number of operations it performs; (b) provides arcless switching; and (c) is indifferent to the interval between switching operations.

One method of fabricating a solid state, electronic switch is to use a thermo-mechanical temperature sensing probe and to use a metallic contact to turn a solid state output device such as, for example, a transistor, on and off. Such a switch is undesirable, however, because such a switch would still be limited, in the manner described above, by the use of metallic contacts and by the use of a thermo-mechanical temperature sensing probe. These limitations may be overcome by developing means for performing temperature sensing functions and means for performing output-control functions which are fabricated using electronic components. This is not as simple as it sounds, however, because, when the electrical load is switched on, the voltage drop across the terminals of a typical two-wire, thermal switch that has a solid state output device is in the range of 0.5 volts to about 2.0 volts—the specific value depends on the load and the operating characteristics of the solid state output device used. In practice, the voltage drop across the switch is deliberately designed to be small or negligible when the switch is on to minimize power dissipation in the switch. A problem arises in this regard because this small voltage drop is not adequate to power electronic circuits in the switch which are used to sense temperature and circuits in the switch which are used to provide electronic output-control. As a result, a voltage source is required to provide power to electronic components which would be used in such a thermal switch application.

One method of solving the need to provide power is to use a battery. However, this solution is undesirable because maintenance is required whenever a battery is used. An alternative method of solving this need to provide power is to add a third wire to the switch to supply the switch directly with power from the power source which is connected to the load. However, this solution is undesirable in an application in which an all-electronic switch is to replace a two-wire, electromechanical switch without subsidiary changes.

As a result, there is a need in the art for a two-wire, electronic switch which performs sensing functions, measurement functions, and output-control functions for an electrical load without receiving power from a power source, external or internal, other than the power source for the electrical load that is controlled by the switch, and for a two-wire, electronic switch which can do all of that notwithstanding whether the switch is on or off.

SUMMARY OF THE INVENTION

Embodiments of the present invention satisfy the above-described need in the art by providing a two-wire, electronic switch which performs sensing functions, measurement functions, and output-control functions for an electrical load without receiving power from a power source, external or internal, other than the power source for the electrical load that is controlled by the switch. As a result, embodiments of the present invention advantageously may be used in applications where additional wiring and access to additional power sources are inconvenient or unavailable.

An embodiment of a two-wire, electronic switch which is fabricated in accordance with the present invention comprises means for providing an output voltage when the switch is on in response to an input current, which output voltage is sufficient to operate electronic components in the two-wire, electronic switch. In particular, such voltage providing means is comprised of photovoltaic devices and an embodiment of the present invention utilizes electronic components that consume microwatts of power for performing: (a) sensing functions such as, for example, for temperature sensing; (b) measurement functions; and (c) output-control functions.

As a result, electronic components of a two-wire, electronic switch which is fabricated in accordance with the present invention obtain power: (a) when the switch is off, from a power source which drives a load which is controlled by the switch and (b) when the switch is on, from an output of a current-to-voltage conversion device which receives at least a portion of a current through the load as input.

Embodiments of the present invention are two-wire, electronic, thermal switches which provide advantages over two-wire, electromechanical thermal switches for many reasons. Some of the advantages of a solid state switch over an electromechanical switch that utilizes metallic contact switching were discussed above in the Background of the Invention. However, electronic switches provide an advantage over electromechanical switches for the following, additional reasons: (a) an electronic switch can utilize an electronic sensor which has negligible thermal or physical mass—this is advantageous because a low mass device inherently responds rapidly and, as a result, a switch which utilizes such a low mass device can be designed to react quickly to changes in a physical property being sensed; (b) an electronic switch does not utilize components having spring properties and mass in its transducer or switching mechanisms (referring to a portion of a switch that operates output-control in response to a sensed physical condition)—this is advantageous because such an electronic switch has an inherent immunity to shock and vibration that is absent in an electromechanical switch; and (c) an electronic switch can be designed wherein conditions for switching are established using many different techniques for electronic circuit implementation, including digital signal processing—this is advantageous because the switched output for an electronic, thermal switch, for example, can be made a function of the time rate of change of temperature or of any temperature/time function and special temperature input conditions can be selected or discriminated against as a basis for switching.

BRIEF DESCRIPTION OF THE DRAWING

A complete understanding of the present invention may be gained by considering the following detailed description in conjunction with the accompanying drawing, in which.

DETAILED DESCRIPTION

Two-wire, electronic switches which are fabricated in accordance with the present invention may be used in a wide variety of applications. For example, embodiments of the present invention may be used to switch an electrical load as a function of temperature, of pressure, of time, or of some combination of these or other conditions.

Figure 1:
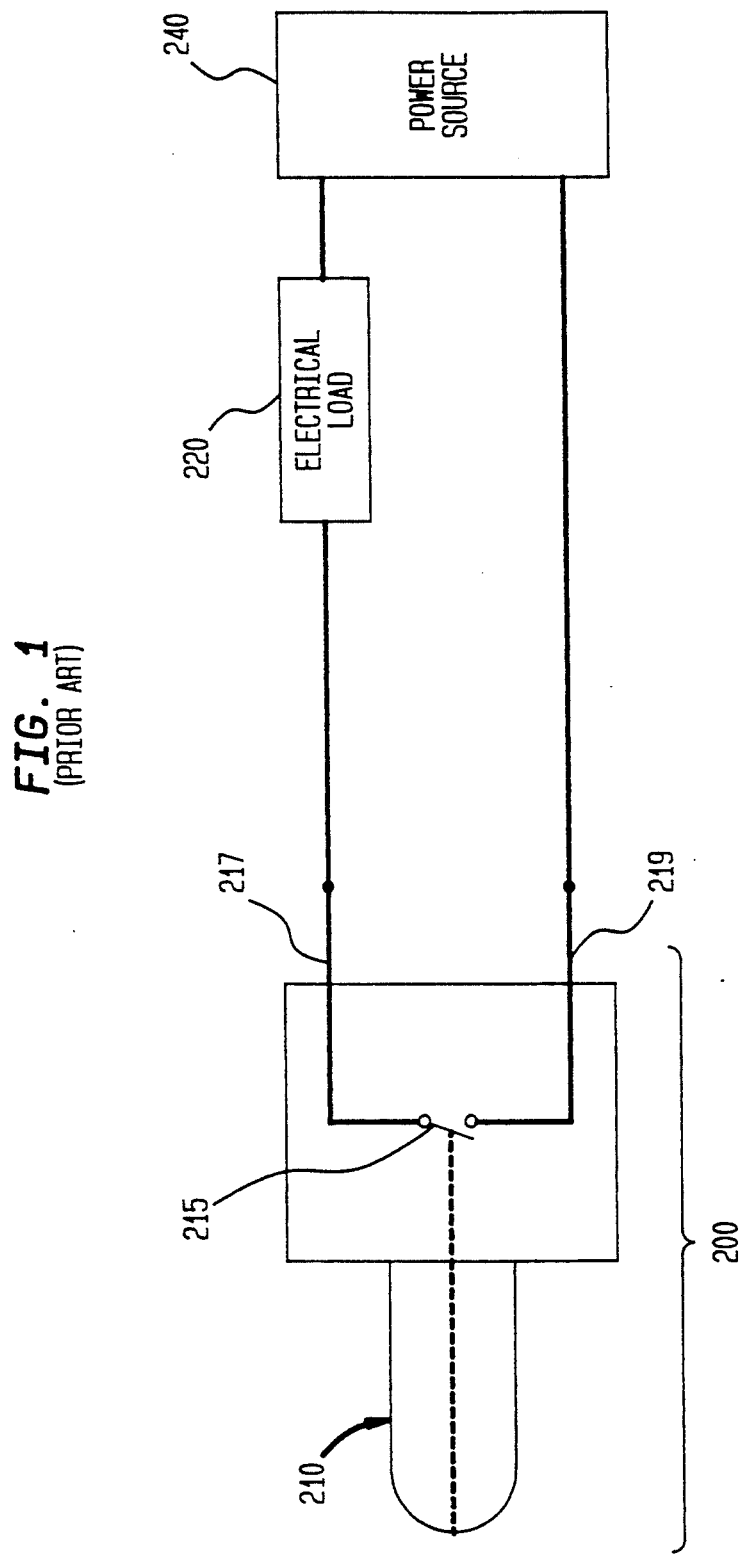
FIG. 1 is a block diagram of a prior art circuit which comprises a two-wire, electromechanical, thermal switch comprised of a temperature sensing probe.
Figure 2:
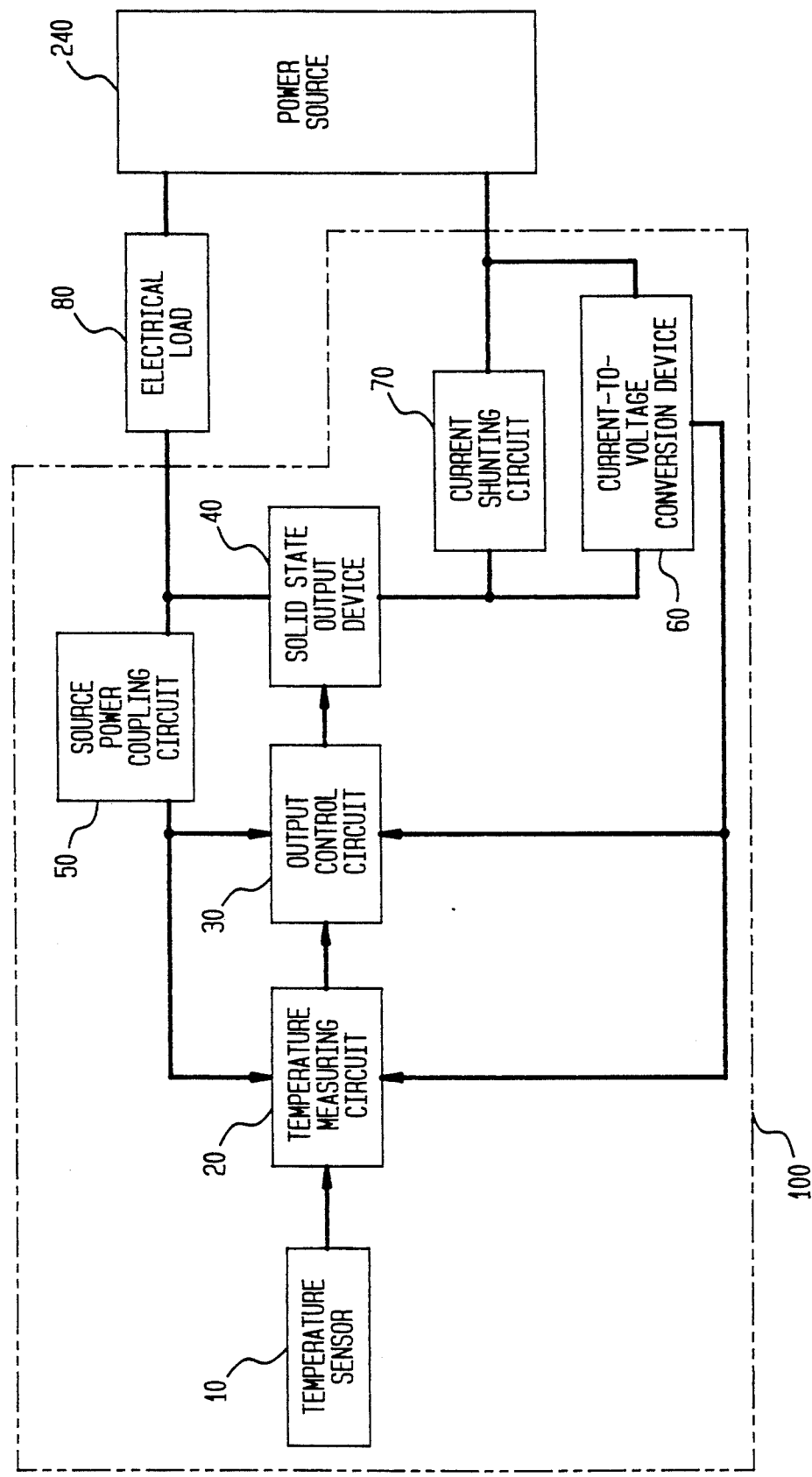
FIG. 2 is a block diagram of a circuit which comprises a two-wire, electronic switch which is fabricated in accordance with the present invention.

The following describes an embodiment of the present invention which is fabricated to switch an electrical load as a function of temperature. The general principles of the present invention can be understood with reference to FIG. 2 which shows a block diagram of a circuit which comprises two-wire, electronic, thermal switch 100 which is fabricated in accordance with the present invention. As shown in FIG. 2, electronic, thermal switch 100 comprises temperature sensor 10 whose output is applied as input to temperature measuring circuit 20. In a preferred embodiment, temperature sensor 10 is comprised of a thermistor in a probe, however, any one of a number of different types of temperature sensors may be selected in place of a thermistor for use as a sensing element in electronic, thermal switch 100. These different types of temperature sensors include, without limitation: an integrated circuit temperature sensor; a thermocouple; a resistance temperature detector (RTD); a radiant energy temperature detector; and any other device that predictably changes its current, voltage, resistance, or some other electrical parameter as a consequence of a change in temperature. Note that a thermistor provides an output which is a non-linear function of temperature input. As a result of this, a thermistor is particularly appropriate for use in a thermal switching application as opposed to a temperature measuring application where a device whose output is a linear function of input temperature is more suitable. The thermistor is appropriate for use in a thermal switching application because its non-linear behavior permits one to select a thermistor that has a rapid rate of change of resistance with temperature at a switching point for each application so that the switch is immune to noise and is precise in its operating temperature.

As shown in FIG. 2, output from temperature sensor 10 is applied as input to temperature measuring circuit 20 and output from temperature measuring circuit 20 is applied, in turn, as input to output control circuit 30. In an embodiment wherein temperature sensor 10 comprises a thermistor, temperature measuring circuit 20 may comprise a resistance bridge and temperature sensor 10 may appear electrically as an arm in the input resistance bridge. Further, when temperature sensor 10 appears as an arm in a resistance bridge of temperature measuring circuit 20, output control circuit 30 may comprise a voltage comparator which provides one output, low or high, whenever the bridge is unbalanced to one polarity and the opposite output whenever the bridge is unbalanced to the opposite polarity.

As shown in FIG. 2, output from output control circuit 30 is applied as input to solid state output device 40. In a preferred embodiment of the present invention, solid state output device 40 is comprised of a power MOSFET. A power MOSFET is used to fabricate a preferred embodiment of the present invention because a power MOSFET has high input impedance and its controlling gate requires negligible current at moderate voltages. Further, MOSFETs having an on-resistance of tenths or hundredths of an ohm are readily available commercially. As a result, the power required to support output device 40 can be made a negligible part of the total power dissipation of two-wire switch 100.

The output from output control circuit 30 which is applied as input to solid state output device 40 causes the input of solid state output device 40—preferably, the gate of a power MOSFET—to go high or low, depending on the polarity of unbalance of the bridge in temperature measuring circuit 20. In response, solid state output device 40 is turned on or off. This provides the switching action required at a particular sensed temperature or at a particular detected temperature function.

Whenever two-wire, electronic switch 100 is off, i.e., output device 40 is turned off, two-wire, electronic switch 100 is powered to perform its sensing, measuring, and output-control functions by source power coupling circuit 50 shown FIG. 2. For an embodiment wherein electrical load 80 is a DC load, an embodiment of source power coupling circuit 50 comprises a resistor which has substantially higher resistance than that of electrical load 80 and which is connected in series with a diode which has its anode toward the positive terminal of power source 240. This provides that current drawn by switch 100 is as small as possible and it is desirable to keep the current small since current constitutes leakage of switch 100 in the off-state. While the polarity of a DC power source must be observed at switch 100—unless, for example, a full-wave bridge rectifier is incorporated in switch 100, which full-wave rectifier will incur the penalty of an additional two-diode voltage drop in series with electrical load 80 and produce, thereby, more power dissipation—an inadvertent power reversal can be accommodated by power component rating choices as long as an always-on or always-off switch, depending on whether or not a transient suppression diode is used at the output, can be tolerated in an application for the period from time of connection to time of discovery. As is well known, the period from time of connection to time of discovery refers to the duration of the reversed connection. Electronic switch 100 will not itself be damaged. Furthermore, electrical load 80 can be placed in series with switch 100 and either the positive terminal or the negative terminal of the DC power source, except as considerations of shielding against electrical noise may affect the choice in an application. The output from source power coupling circuit 50 is applied as input to provide power to temperature measuring circuit 20 and output control circuit 30.

Whenever two-wire, electronic switch 100 is on, i.e., output device 40 is turned on, the voltage drop across the terminals of two-wire, electronic switch 100 is typically reduced to a value that is insufficient to support the operation of electronic circuitry in the switch such as, for example, electronic circuitry in temperature sensor 10, temperature measuring circuit 20, and output control circuit 30. In accordance with the present invention, two-wire, electronic, thermal switch 100 performs sensing functions, measurement functions, and output-control functions without receiving power from an internal power source such as battery and while maintaining the same precision and accuracy in temperature measuring circuit 20 as when switch 100 is off, by utilizing current-to-voltage conversion device 60 shown in FIG. 2.

Photovoltaic devices comprise one form of current-to-voltage conversion device. A photovoltaic device is an integrated circuit device: (a) whose input and output are electrically isolated from each other; (b) which provides a DC voltage output at a microampere current level in response to a milliampere current that is applied to a light emitting diode (LED) input of the photovoltaic device; and (c) which provides a voltage output at a current level that can operate micropower electronic devices. For example, presently available photovoltaic devices can provide operating power from input currents of 20 to 40 milliamperes that are adequate to operate presently available micropower operational amplifier integrated circuits such as a Type MAX480 integrated circuit which is available from Maxim. Specifically, in a preferred embodiment of the present invention, current-to-voltage conversion device 60 comprises one or more PVI 5100 Integrated Circuits which are commercially available from International Rectifier. As shown in FIG. 2, output from current-to-voltage conversion device 60 is applied as input to provide power to temperature measuring circuit 20 and to output control circuit 30. Thus, when switch 100 is on, some of the load current is used to operate current-to-voltage conversion device 60 so that the sensing, measuring, and output-control circuits continue to be powered at the same voltage and current levels at which they were powered when switch 100 was off.

Current shunting circuit 70 permits switch 100 to accommodate currents having values above those which are needed to cause current-to-voltage conversion device 60 to operate properly. Preferably, current shunting circuit 70 comprises one or more diodes whose forward voltage drop is nominally constant over a required load current range. Current shunting circuit 70 provides a voltage that is slightly above the voltage drop of an LED (not shown) that is used in photovoltaic devices which comprise a preferred embodiment of current-to-voltage conversion device 60. As a result, the LED will be properly supplied when an appropriate resistor is put in series with it and the LED-resistor combination is connected across current shunting circuit 70. Thus, current shunting circuit 70 is used to enable switch 100 to accommodate a range of load currents.

Electrical load limits for two-wire, electronic switch 100 depend on device technology and can be expected to improve as device technology improves. In particular, the minimum load current for switch 100 is determined by the photovoltaic devices used to fabricate a preferred embodiment of current-to-voltage conversion 60 and the circuits supplied from its output. For example, twenty milliamperes is a reasonable nominal load current minimum for present technology. The maximum load current depends on the amount of dissipation that can be tolerated in current shunting circuit 70 and, as one can readily appreciate, application considerations, as well as technology, affect that value.

Input LEDs in the photovoltaic devices used to fabricate a preferred embodiment of current-to-voltage conversion 60 can be placed in series or in parallel and the combination can be placed in series with solid state output device 40 and load 80 in order to accommodate load currents that are moderately above the maximum rating of the photovoltaic devices so that current shunting circuit 70 may be omitted in some embodiments of the present invention. Operation of these photovoltaic devices is such that combining outputs in series or parallel provides more voltage or current, respectively, so that adjustments can be made for the voltage and current requirements of a particular circuit being powered in two-wire switch 100.

Figure 4:
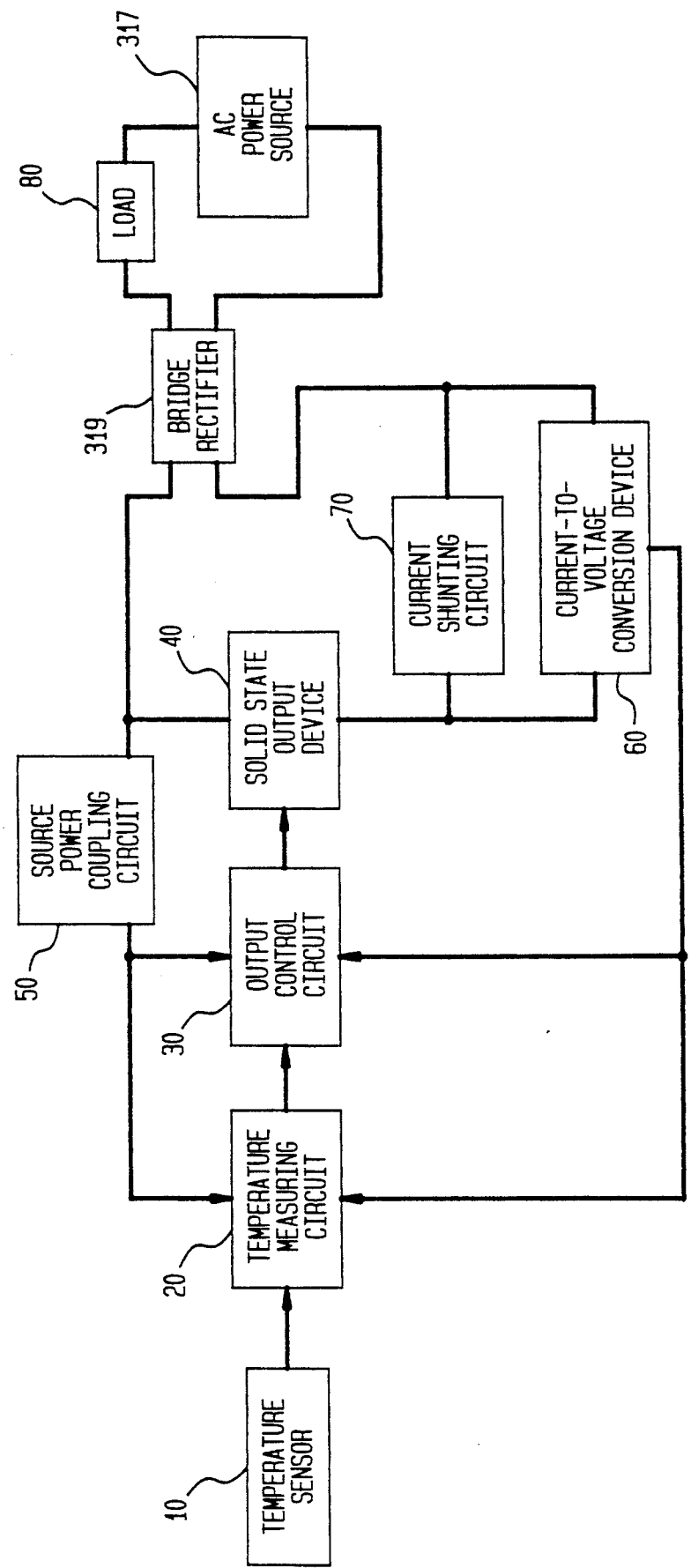
FIG. 4 is a block diagram of a circuit which comprises a two-wire, electronic switch which is fabricated in accordance with the present invention.

Although FIG. 2 provides a block diagram which illustrates two-wire switch 100 operating from a DC power source, it should be clear to those of ordinary skill in the art that embodiments of the present invention can operate from an AC power source by rectifying the source AC for the sensing, measuring, output-control circuits. This is shown in FIG. 4 which displays a block diagram of a circuit which comprises a two-wire, electronic switch which is fabricated in accordance with the present invention. In FIG. 4, AC power 317 is in series with load 80 and in parallel with bridge rectifier 319, which bridge rectifier is a full wave bridge rectifier which is well known to those of ordinary skill in the art. Further, as is well known to those of ordinary skill in the art, block 317 in FIG. 4 may be, for example, a source of alternating current such as ordinary 110 volt AC or the secondary of a step-down transformer supplying 24–36 volts. As another example, this may be done by configuring two MOSFETS as a solid state output circuit capable of turning an AC load on and off and by locating the inputs of photovoltaic devices that sustain operation when the switch is on in series with each MOSFET.

Figure 3:
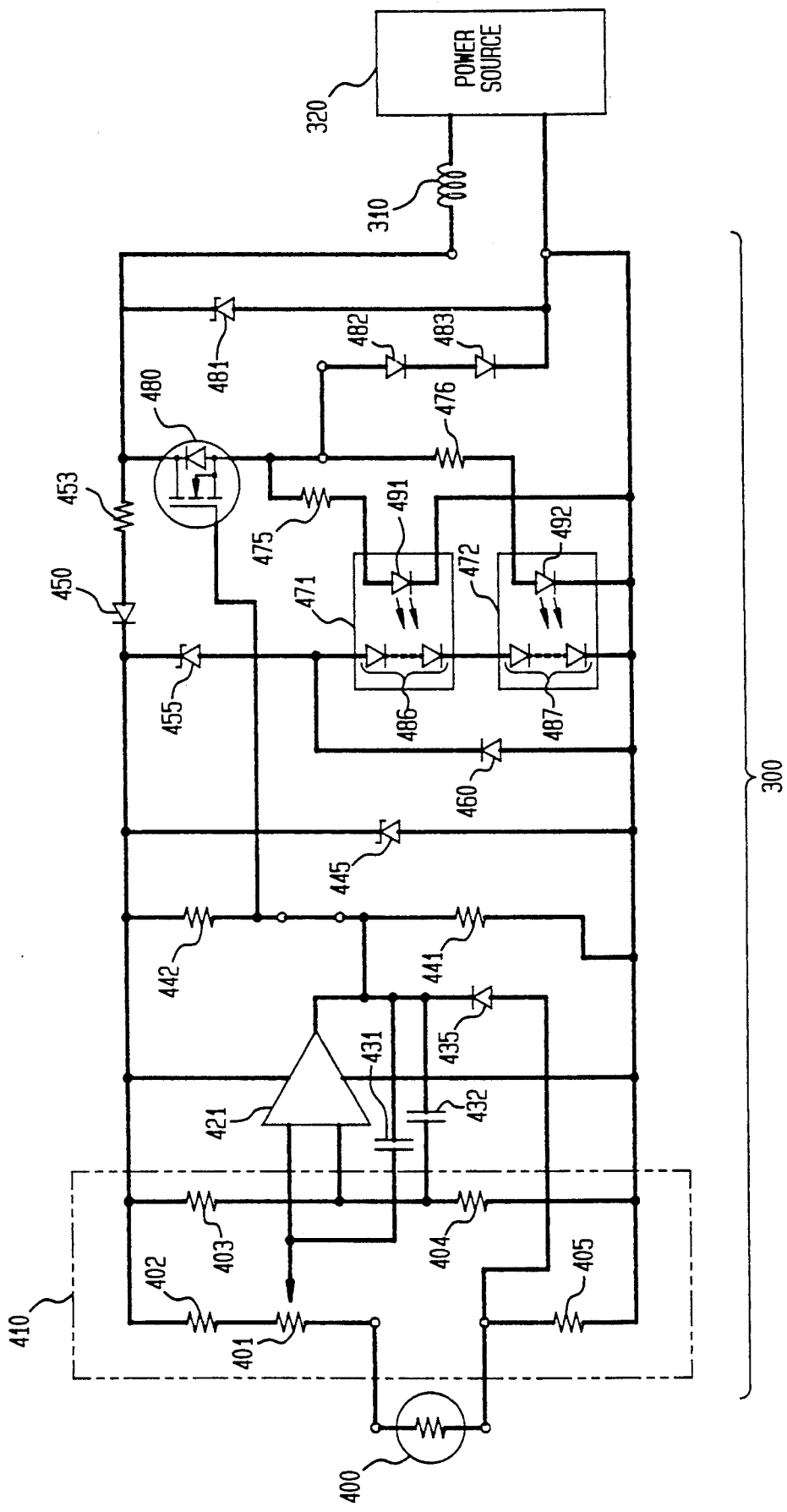
FIG. 3 is a circuit diagram of a preferred embodiment of a two-wire, electronic switch which is fabricated in accordance with the present invention.

FIG. 3 shows a circuit diagram of two-wire, open-on-rise, electronic, thermal switch 300 which is a preferred embodiment of the present invention. As shown in FIG. 3, temperature sensor 400 is a thermistor, i.e., a negative temperature coefficient resistor, which is mounted in a probe (not shown) to protect it from an environment being monitored. Thermistor 400 is combined with resistors 401, 402, 403, 404, and 405 to form Wheatstone Bridge temperature measuring circuit 410. Trimmer resistor 401 forms a part of Wheatstone bridge 410 and is used to adjust to different switch operating temperatures or it may be used to correct for thermistor tolerance at a selected operating temperature. Further, resistor 405 provides a fixed differential between the on and off temperatures of switch 300.

Comparator 421 senses the polarity of unbalance of Wheatstone bridge circuit 410. Capacitors 431 and 432 contribute to the stability and speed, respectively, of switching transitions of comparator 421. As shown in FIG. 3, diode 435 blocks the output of comparator 421 whenever the output is a high voltage and diode 435 removes resistor 405 from input Wheatstone bridge 410 whenever the output of comparator 421 is a low voltage.

Resistors 441 and 442 form a voltage divider that keeps MOSFET 480 on in saturation whenever the output of comparator 421 is a high voltage. Further, whenever the output of comparator 421 is a low voltage, MOSFET 480 is held off. As shown in FIG. 3, zener diode 445 regulates the voltage to sensing thermistor 400, to measuring bridge 410, and to output-control comparator 421.

Whenever electronic switch 300 is off, diode 450 and resistor 453 connect power from power source 320 which is applied to inductive electrical load 310 to sensing thermistor 400 to measuring bridge 410, and to output-control comparator 421.

Whenever electronic switch 300 is on, diode 450 is reverse biased and zener diode 455 connects power from photovoltaic devices 471 and 472 to sensing thermistor 400, to measuring bridge 410, and to output-control comparator 421. As shown in FIG. 3, the outputs of photovoltaic devices 471 and 472 are placed in series to enable the combination to provide a suitable voltage for the circuit. Diode 460 protects the outputs of photovoltaic devices 471 and 472 from any reverse current that might exceed their ratings. Diode 455 is a zener diode to provide additional protection against exceeding the reverse voltage rating of the outputs of photovoltaic devices 471 and 472.

Electrical load 310 is an inductive load and, as a result, zener diode 481 is used as a transient suppression diode that protects switch components from transients which are created when switching off an inductive load.

In accordance with the present invention photovoltaic devices 471 and 472 sustain power on the internal circuits of two-wire electronic switch 300 when the switch is on. This occurs when some of the current required by load 310 is used to turn on LEDs 491 and 492 in the inputs of photovoltaic devices 471 and 472, respectively. In response, photovoltaic devices 471 and 472 generate voltage at their outputs which is used to sustain power on the internal circuits of switch 300. The remaining current required by load 310 is shunted by diodes 482 and 483. Resistors 475 and 476 are in series with LED inputs 491 and 492 of photovoltaic devices 471 and 472, respectively, to insure proper current distribution despite voltage drop differences in the LEDs.

As long as switch 300 is on, LEDs 491 and 492 in photovoltaic devices 471 and 472, respectively, are on and the outputs of photovoltaic devices 471 and 472 provide the power required by the internal circuits of switch 300. Whenever switch 300 is off, the power required by the internal circuits of switch 300 is provided by power source 320 that supplies load 310. As a result, only two wires are needed for the controlled operation of electronic thermal switch 300.

The impedances of the devices and the components which comprise switch 300 are preferably very high in order to maintain power requirements within the capability of available photovoltaic devices.

Those skilled in the art recognize that further embodiments of the present invention may be made without departing from its teachings. For example, embodiments of the present invention may be used to switch an electrical load as a function of temperature, of pressure, of time, or of some combination of these or other conditions. In such an embodiment, the temperature sensing circuit, the temperature measuring circuit, and the output-control circuit would be replaced by appropriate corresponding circuits for the particular condition sensed and for the type of output control which is desired to be obtained.

What is claimed is:

1. Power coupling apparatus for coupling power from a power source to a switch, which switch is comprised of (a) two inputs, (b) means for sensing a condition, and (c) means, in response thereto, for causing the switch to be on or off at its inputs, one of the inputs being returned to a load that is being switched and the other of the inputs being returned to the power source, the power source being further connected to the load to supply current to the load whenever the switch is on, the power apparatus comprising:

switch-off-power means for coupling power from the power source to the switch whenever the switch is off; and switch-on-power means for extracting power from the power source and for coupling the extracted power to the switch whenever the switch is on, wherein the switch-on-power means comprises:

(a) means for extracting current supplied to the load from the power source, and (b) supply means, in response to the extracted current, for providing an output voltage which is coupled to the switch wherein the supply means comprises one or more photovoltaic devices.

2. The power coupling apparatus of claim 1 wherein the power source is a DC power source and the switch-on-power means extracts current from the DC power source.

3. The power coupling apparatus of claim 1 wherein the power source is an AC power source and the switch-on-power means extracts current from the AC power source.

4. The power coupling apparatus of claim 1 wherein the power coupling apparatus further comprises means for shunting current around the switch-on-power means.

5. The power coupling apparatus of claim 2 wherein the current shunting means comprises a diode.

6. The power coupling apparatus of claim 1 wherein the one or more photovoltaic devices comprises two or more photovoltaic devices wherein the inputs of at least two of the two or more photovoltaic devices are connected in parallel and the outputs of the at least two of the two or more photovoltaic devices are connected in series.

7. An electronic switch having two inputs, one of the inputs being returned to a load that is controlled by the switch and the other of the inputs being returned to a power source, the power source being further connected to the load to supply current to the load whenever the switch is on, which switch comprises:

sensing means for sensing a physical condition;

measuring means, in connection with the sensing means, for providing an output which is a predetermined function of the physical condition;

output-control means, in response to the output from the measuring means, for causing an output means to be on or off, whereby, the switch is caused to be on or off at the inputs;

switch-off-power means for coupling power from the power source to the measuring means and to the output-control means whenever the switch is off; and switch-on-power means for extracting power from the power source and for coupling the extracted power to the measuring means and to the output-control means whenever the switch is on, wherein the switch-on-power means comprises:

(a) means for extracting current supplied to the load from the power source, and (b) supply means, in response to the extracted current, for providing an output voltage which is coupled to the measuring means and to the output-control means wherein the supply means comprises one or more photovoltaic devices.

8. The electronic switch of claim 7 wherein the switch further comprises means for shunting current around the switch-on-power means.

9. The electronic switch of claim 8 wherein the current shunting means comprises a diode.

10. The electronic switch of claim 7 wherein the output means comprises solid state electronic output means.

11. The electronic switch of claim 10 wherein the solid state electronic output means comprises a MOSFET.

12. The electronic switch of claim 11 wherein the switch-off-power means comprises a diode.

13. The electronic switch of claim 10 wherein:
the sensing means comprises a thermistor;
the measuring means comprises a bridge; and
the output-control means comprises a comparator.

14. The electronic switch of claim 7 wherein the one or more photovoltaic devices comprises two or more photovoltaic devices wherein the inputs of at least two of the two or more photovoltaic devices are connected in parallel and the outputs of the at least two of the two or more photovoltaic devices are connected in series.

15. An electronic switch having two inputs, one of the inputs being returned to a load that is controlled by the switch and the other of the inputs being returned to a power source, the power source being further connected to the load to supply current to the load whenever the switch is on, which switch comprises:

sensing means for sensing a physical condition;

measuring means, in connection with the sensing means, for providing an output which is a predetermined function of the physical condition;

output-control means, in response to the output from the measuring means, for causing an output means to be on or off, whereby, the switch is caused to be on or off at the inputs;

switch-off-power means, in parallel with the output means, for coupling power from the power source to the measuring means and to the output-control means whenever the switch is off; and switch-on-power means, in series with the output means, for extracting power from the power source and for coupling the extracted power to the measuring means and to the output-control means whenever the switch is on, wherein the switch-on-power means comprises:

(a) means for extracting a portion of current supplied to the load from the power source, and (b) supply means, in response to the extracted portion of current, for providing an output voltage which is coupled to the measuring means and to the output-control means wherein the supply means comprises one or more photovoltaic devices.

16. The electronic switch of claim 15 wherein:
the switch-off-power means comprises a diode and a resistance;
the output means comprises a MOSFET; and
wherein the one or more photovoltaic devices comprises two or more photovoltaic devices wherein the inputs of at least two of the two or more photovoltaic devices are connected in parallel and the outputs of the at least two of the two or more photovoltaic devices are connected in series.

* * * * *